() United States Patent (10) Patent No.: US 8,685,166 B2
Youm et al. (45) Date of Patent: Apr. 1, 2014

(54) APPARATUS FOR CONTINUOUS FABRICATING SUPERCONDUCTING TAPES

(75) Inventors: Do-Jun Youm, Daejeon (KR); Ja-Eun Yoo, Daejeon (KR); Byoung-Su Lee, Jeollanam-do (KR); Sang-Moo Lee, Daejeon (KR); Ye-Hyun Jung, Daejeon (KR); Jae-Young Lee, Daejeon (KR)

(73) Assignees: Korea Advanced Institute of Science and Technology, Daejeon (KR); Sunam Co., Ltd., Gyeonggi-do (KR)

( * ) Notice: Subject to any disclaimer, the term of this patent is extended or adjusted under 35 U.S.C. 154(b) by 1240 days.

(21) Appl. No.: 12/530,315

(22) PCT Filed: Mar. 7, 2008

(86) PCT No.: PCT/KR2008/001328
§ 371 (c)(1),
(2), (4) Date: Sep. 8, 2009

(87) PCT Pub. No.: WO2008/108606
PCT Pub. Date: Sep. 12, 2008

(65) Prior Publication Data
US 2010/0107979 A1 May 6, 2010

(30) Foreign Application Priority Data
Mar. 8, 2007 (KR) .................. 10-2007-0022899

(51) Int. Cl.
*B05C 11/00* (2006.01)
*B05C 13/00* (2006.01)
*B05C 15/00* (2006.01)
*C23C 16/00* (2006.01)

(52) U.S. Cl.
USPC ............................................ 118/718; 118/65

(58) Field of Classification Search
USPC .................... 118/718, 65; 156/345.2
See application file for complete search history.

(56) References Cited

U.S. PATENT DOCUMENTS

| 4,013,539 | A | | 3/1977 | Kuehnle |
| 5,098,276 | A | | 3/1992 | Jarabak et al. |
| 5,460,853 | A | * | 10/1995 | Hintz et al. ............... 427/255.5 |
| 5,618,388 | A | | 4/1997 | Seeser et al. |
| 6,147,033 | A | | 11/2000 | Youm et al. |

FOREIGN PATENT DOCUMENTS

| JP | 3-276521 | 12/1991 |
| JP | 09-102228 A | 4/1997 |
| JP | 2004-31621 | 1/2004 |
| KR | 10-0276003 | 9/2000 |
| KR | 10-2005-0048590 A | 5/2005 |
| KR | 10-0683132 | 2/2007 |
| KR | 10-0750654 | 8/2007 |

* cited by examiner

*Primary Examiner* — Karla Moore
*Assistant Examiner* — Nathan K Ford
(74) *Attorney, Agent, or Firm* — Rabin & Berdo, P.C.

(57) ABSTRACT

Provided is an apparatus for continuously fabricating superconducting tapes. An evaporation using drum in dual chamber (EDDC) method is suitable for mass production of high-temperature superconducting tapes. However, the EDDC method is limited to fabrication of high-temperature superconducting tapes having a limited length. In an attempt, high-temperature super-conducting tapes having a sufficiently large length can be fabricated using the EDDC method by releasing a long high-temperature superconducting tape from one reel and winding the long high-temperature superconducting tape around the other reel. In this case, it is important to stably move a high-temperature superconducting tape spirally wound around a drum from one reel to the other reel. Therefore, the provided apparatus uses endless tract belts separately disposed around a drum to stably and continuously move a high-temperature superconducting tape spirally wound around the drum along the centerline of the drum from one reel to the other reel.

14 Claims, 5 Drawing Sheets

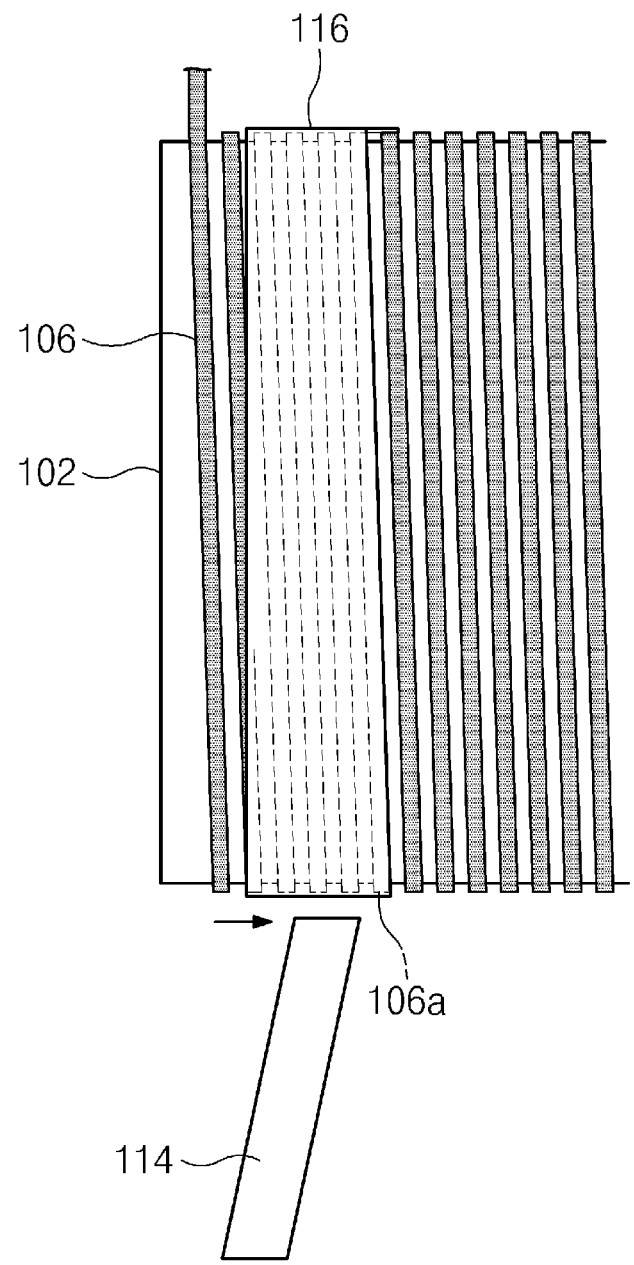

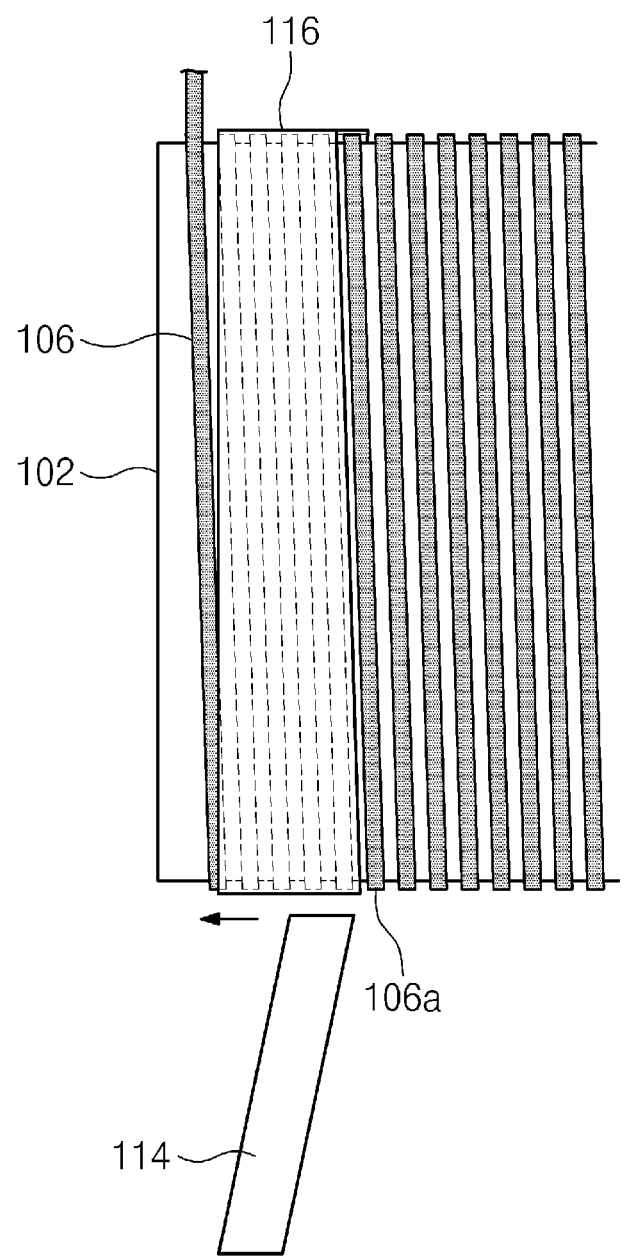

APPARATUS FOR CONTINUOUS FABRICATING SUPERCONDUCTING TAPES

TECHNICAL FIELD

The present invention disclosed herein relates to an apparatus for fabricating superconducting tapes, and more particularly, to an apparatus for fabricating long superconducting tapes by depositing a superconductor material on the long superconducting tape while continuously moving the long superconducting tape.

BACKGROUND ART

In the application fields of superconductors, much research has been conducted all over the world for practical use of high-temperature superconductors. There are a first-generation high-temperature superconducting tape and a second-generation high-temperature superconducting tape. The first-generation high-temperature superconducting tape can be fabricated through a powder in tube (PIT) process in which precursor powder is treated in a silver (Ag) pipe. The second-generation high-temperature superconducting tape is technically called as a coated conductor (CC). Institutes and companies of many countries have conducted research on CCs. Many fabricating methods have been developed for CCs. CCs have a more complicated multilayer structure than that of the first-generation high-temperature superconducting tape.

It is considered that a superconducting tape will become the first practical superconductor product since the discovery of a high-temperature superconductor in 1986. A high-temperature superconducting tape can carry about one hundred times greater current per unit area substantially with no loss as compared with a copper wire. Since heat generates in proportional to the power loss of an electric power device, the electric power device can be heated to a high temperature due to a power loss. Therefore, copper wires having a relatively large resistance are not suitable for high capacity power devices. However, high-temperature superconducting tapes can be usefully used for high capacity power devices. Niobium based low-temperature super conductors are not economical since they require expensive liquid helium due to their extremely low critical temperature. However, high-temperature superconducting tapes are economical since they require liquid nitrogen that can be easily obtained from air. Therefore, practical use of high-temperature superconducting tapes will mark a new era in large-scale energy industries. When the high-temperature superconductor was first discovered, although the high-temperature superconductor was considered to be the next generation of conductors, it was difficult to develop high-temperature superconducting tapes. However, recent dramatic technical development makes it possible to practically use of the high-temperature superconductor. For this, it is important to develop a method of rapidly fabricating superconducting tapes with low costs. There are many methods that can be practically used for fabricating superconducting tapes, such as a metal-organic deposition (MOD) method, a metal-organic chemical vapor deposition (MOCVD) method, and an evaporation using drum in dual chamber (EDDC) method. The EDDC method is disclosed in U.S. Pat. No. 6,147,033, filed by the applicant of the present invention, entitled "Apparatus and method for forming a film on a tape substrate."

In the EDDC method, a vacuum chamber divided into three chambers is used. In detail, a drum is rotated in an upper auxiliary chamber under oxygen gas atmosphere at a pressure of about 5 mTorr. A substrate tape having a width of about 4 mm and thickness of about 0.1 mm or less is wound around the drum. The substrate tape and the drum are heated to a temperature of about 700° C. and are rotated at a speed of about 1 revolution per second. A lower main chamber is kept at a pressure of about 0.01 mTorr. The low main chamber supplies raw materials such as samarium (Sm), barium (Ba), and copper (Cu) to the rotating substrate tape in the form of atomic vapor to form a high-temperature superconductor layer on the rotating substrate tape. Here, the ratio of the raw materials (for example, Sm:Ba:Cu=1:2:3) supplied from the main chamber is precisely maintained. While the substrate tape is being rotated between an evaporation region and a reaction region in the auxiliary chamber, the high-temperature superconductor layer is grown on the substrate tape.

However, since the length of the substrate tape wound around the drum is limited, a long high-temperature superconducting tape cannot be fabricated through the EDDC method. Therefore, it is necessary to improve the EDDC method to fabricate a sufficiently long high-temperature superconducting tape. For example, a high-temperature superconducting tape having a sufficiently large length can be fabricated using two reels coaxially disposed at both sides of a drum by depositing a superconductor material on the high-temperature superconducting tape while releasing the high-temperature superconducting tape from one real and winding the superconducting tape around the other reel. Here, the high-temperature superconducting tape is wound around inner regions of the reels.

DISCLOSURE OF INVENTION

Embodiments of the present invention provide apparatuses for continuously fabricating superconducting tapes. The apparatuses may include: a chamber configured to deposit a superconducting material; a hollow cylindrical drum disposed in the chamber for winding a superconducting tape around the cylindrical drum and heating the superconducting tape; a release reel disposed at an end of the cylindrical drum for feeding the superconducting tape; a winding reel disposed at the other end of the cylindrical drum for collecting the superconducting tape after the superconducting material is deposited on the superconducting tape; and a transfer unit configured to transfer the superconducting tape from the release reel to the winding reel.

In some embodiments, the transfer unit may include: an endless track belt disposed around a sidewall of the cylindrical drum in a loop shape parallel to a centerline of the cylindrical drum, the endless track belt including grooves arranged at predetermined intervals in a length direction of the endless track belt for receiving the superconducting tapes, the grooves being substantially perpendicular to the length direction of the endless belt; and belt reels configured to rotate the endless track belt so as to move a portion of the endless track belt along an outer surface of the cylindrical drum in a direction from the release reel to the winding reel.

In other embodiments, each of the grooves may include: support jaw portions configured to support both sides of the superconducting tape for preventing the super-conducting tape from making contact with a bottom surface of the groove; and a reversely inclined sidewall to make the groove tapered upwardly for preventing the superconducting tape from being easily releasing from the groove.

In still other embodiments, the support jaw portions may be sloped toward sidewalls of the groove such that the superconducting tape makes line contact with the support jaw portions.

In even other embodiments, the transfer unit may be provided in plurality, wherein the transfer units are radially and symmetrically arranged about the centerline of the cylindrical drum.

In yet other embodiments, the superconducting tape may be released from an inner region of the release reel and is wound around an inner region of the winding reel.

In further embodiments, a material may be disposed on a portion of the outer surface of the cylindrical drum between the endless track belt and another endless track belt so as to kept the portion of the outer surface of the cylindrical drum at the same surface temperature level as the endless track belt.

In still further embodiments, the apparatus may further include a spiral block disposed at a side of the release reel for separating a portion of the superconducting tape on which the superconducting material is being deposited from the remaining portion of the superconducting tape in a stepped manner. When the superconducting tape is exposed to a deposition vapor, the spiral block may reciprocate in a stepped manner such that each turn of the superconducting tape wound around the cylindrical drum is simultaneously exposed to the deposition vapor.

In yet further embodiments, the cylindrical drum, the superconducting tape wound around the cylindrical drum, the release reel feeding the superconducting tape, the winding reel collecting the superconducting tape, the endless track belts, and the belt reels rotating the endless belts may be rapidly rotated in association with each other to release the superconducting tape from the release reel and wind the superconducting tape around the winding reel, such that a portion of the superconducting tape spirally wound around the cylindrical drum with a predetermined gap between the superconducting tape and the cylindrical drum is moved on the belts along the centerline of the cylindrical drum from the release reel to the winding reel, and the superconducting material is deposited on the portion of the superconducting tape.

BRIEF DESCRIPTION OF THE DRAWINGS

FIGS. 6 and 7 are schematic views for explaining how the vapor block operates, according to an embodiment of the present invention.

BEST MODE FOR CARRYING OUT THE INVENTION

Preferred embodiments of the present invention will be described below in more detail with reference to the accompanying drawings. The present invention may, however, be embodied in different forms and should not be construed as limited to the embodiments set forth herein. The entire contents of U.S. Pat. No. 6,147,033 may be incorporated herein by reference.

Figure 1:
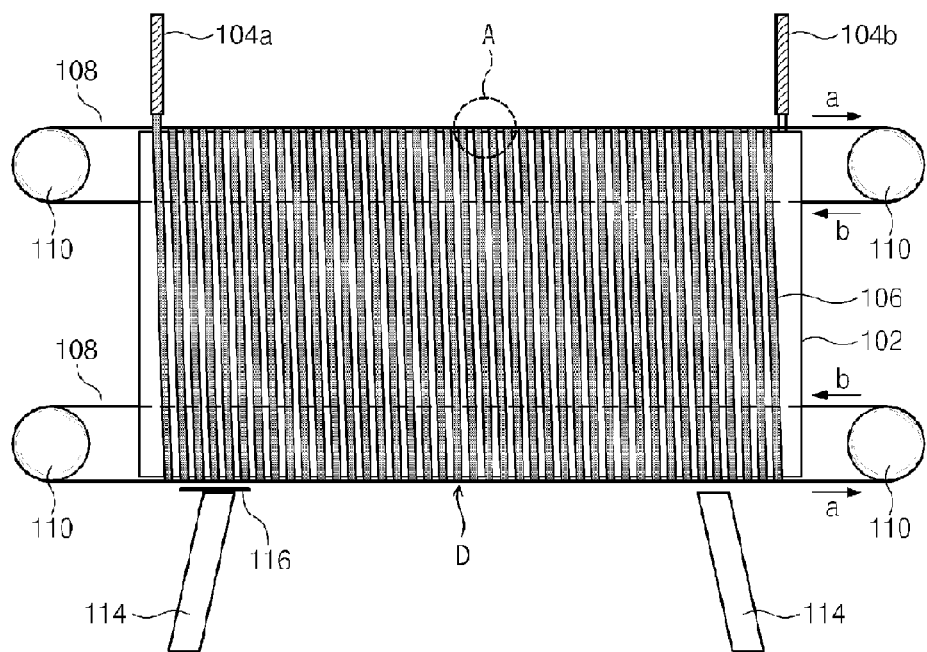
FIG. 1 is a schematic view illustrating an apparatus for continuously fabricating super conducting tapes according to an embodiment of the present invention.

FIG. 1 is a schematic view illustrating an apparatus for continuously fabricating superconducting tapes according to an embodiment of the present invention. For clarity, a release reel 104a and a winding reel 104b are illustrated by cutting them along a plane including the centerline and upper edge line of a hollow cylindrical drum 102. All elements of the apparatus shown in FIG. 1 are disposed in a superconductor deposition chamber (not shown). Referring to FIG. 1, a superconducting tape 106 is placed on an outer surface of the hollow cylindrical drum 102, and the hollow cylindrical drum 102 is disposed in the superconductor deposition chamber for heating the superconducting tape 106. The superconducting tape 106 on which a superconducting material will be deposited is released from the release reel 104a disposed at the left side of the cylindrical drum 102. The superconducting tape 106 is released from an inner region of the release reel 104a and is wound around an inner region of the winding reel 104b. That is, after a superconducting material is deposited on the superconducting tape 106, the superconducting tape 106 can be collected by winding the superconducting tape 106 around the inner region of the winding reel 104b. The winding reel 104b is disposed at the right side of the cylindrical drum 102. While a superconducting material is being deposited on the superconducting tape 106, the superconducting tape 106 is transferred from the release reel 104a to the winding reel 104b by a transfer unit. The transfer unit includes an endless track belt 108 and belt reels 110. The endless track belt 108 includes grooves (H) (refer to FIG. 2) for receiving the superconducting tape 106. The belt reels 110 rotate the endless tack belt 108 such that a portion of the endless track belt 108 disposed outside the cylindrical drum 102 can be moved in the direction of arrow (a) from the release reel 104a to the winding reel 104b. The endless track belt 108 is disposed in a loop shape around a sidewall of the cylindrical drum 102 in parallel with the centerline of the cylindrical drum 102. The transfer unit can be provided in plurality. In this case, a plurality of transfer units may be radially and symmetrically arranged about the centerline of the cylindrical drum 102. Thus, owing to the symmetrically arranged transfer units, the superconducting tape 106 can be stably placed and transferred on the belts 108. The grooves (H) of the belt 108 are arranged in predetermined intervals along the length direction of the belt 108 and are substantially perpendicular to the length direction of the belt 108. When the superconducting tape 106 is transferred on the belt 108, the superconducting tape 106 is disposed in the grooves (H). During a superconductor material deposition process, the belt 108 is moved along an outer surface of the cylindrical drum 102 in parallel with the centerline of the cylindrical drum 102 in the direction of arrow (a) with the superconducting tape 106 being placed thereon. Then, the superconducting tape 106 is separated from the belt 108, and the belt 108 is moved through the cylindrical drum 102 in the direction of arrow (b). Therefore, the superconducting tape 106 can be continuously fed to the cylindrical drum 102. The belt reels 110 need to be rotated at the same speed to continuously transfer the superconducting tape 106 on the belts 108.

In FIG. 1, reference numeral 112 denotes a boat in which high-temperature superconducting materials are contained, and reference numeral 114 denotes chamber barrier walls for dividing the superconductor deposition chamber into an evaporation region and a reaction region. Reference numeral 116 denotes a block. The evaporation region may be an upper region of the boat 112 where the high-temperature superconducting materials evaporate from the boat 112. In the reaction region, the evaporated superconducting materials react with each other. The reaction region may be a region where the superconducting tape is placed. A deposition region (D) is a region where the evaporated superconducting materials may be deposited on the superconducting tape.

Figure 2:
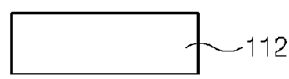
FIG. 2 is an enlarged view of portion A of FIG. 1, according to an embodiment of the present invention.

FIG. 2 is an enlarged view of portion A of FIG. 1, according to an embodiment of the present invention. FIG. 2 shows a cross-sectional view of portion A of FIG. 1 taken along a plane including the centerline and upper edge line of the cylindrical drum 102. Referring to FIG. 2, the grooves (H) are formed in the belt 108 at predetermined intervals and are substantially perpendicular to the length direction of the belt 108. Therefore, when the superconducting tape 106 is wound around the cylindrical drum 102, the superconducting tape 106 can be stably disposed in the grooves (H) of the belt 108. In detail, support jaw portions 210 are formed in each of the grooves (H) to support both sides of the superconducting tape 106 such that the superconducting tape 106 can be spaced a predetermined distance apart from the bottom of the groove (H). That is, the superconducting tape 106 is not in contact with the bottom surfaces of the grooves (H). In addition, the support jaw portions 210 are sloped down toward sidewalls 220 of the groove (H) such that the superconducting tape 106 can make line contact with the support jaw portions 210. Owing to the support jaw portions 210, the contact area between the superconducting tape 106 and the belt 108 can be minimized, and thus the superconducting tape 106 can be less damaged or contaminated by the contact with the belt 108. Sidewalls 220 of the grooves (H) are reversely inclined. That is, the grooves (H) are tapered upwardly. Therefore, the superconducting tape 106 is not freely released from the grooves (H).

Figure 3:
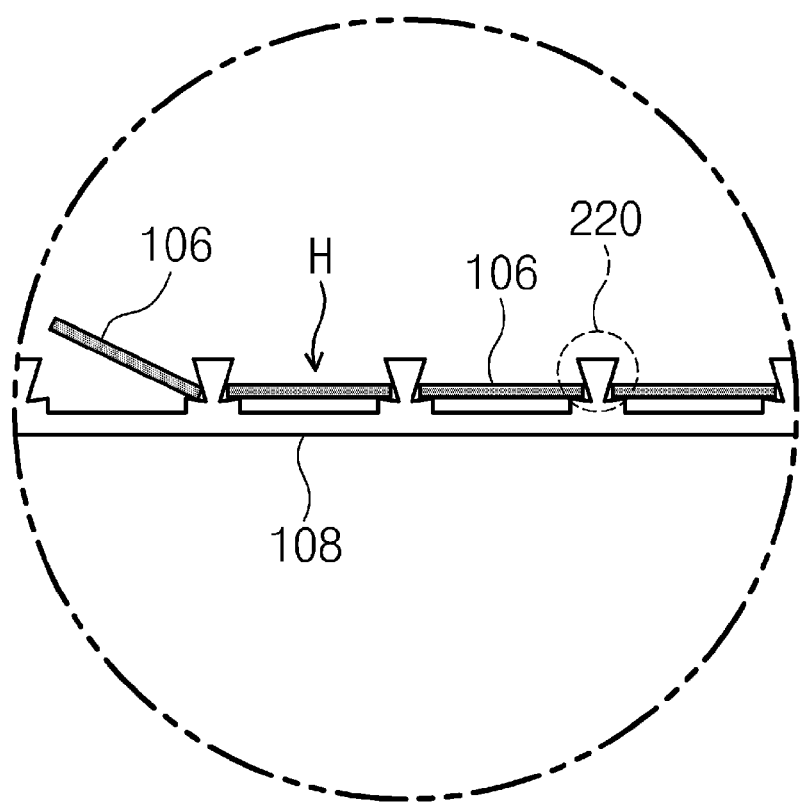
FIG. 3 is an enlarged view of portion B of FIG. 1, according to an embodiment of the present invention.

The width of the grooves (H) may be smaller than that of the superconducting tape 106. In this case, additional mechanism may be necessary to stably insert the superconducting tape 106 into the groove (H) after the superconducting tape 106 is released from the release reel 104a. For example, referring to FIG. 3, the superconducting tape 106 may be inserted into the groove (H) at a twisted angle. For this, the centerline of the release reel 104a may have an angle with the belt 108. Alternatively, an additional support unit may be disposed between the release reel 104a and the belt 108 to support a bottom surface of the superconducting tape 106 at an oblique angle with the belt 108. Alternatively, the belt 108 may be bent to widen the groove (H) in the vicinity of the release reel 104a. To allow the superconducting tape 106 is stably released from the groove (H) and then be wound around the winding reel 104b, the same mechanism may be used.

The belt 108 may be formed of a material having the same thermal expansion co-efficient as the superconducting tape 106. For example, the belt 108 may be formed of a hast alloy. The belt 108 is thin at about 3 mm so that the belt 108 can be easily bent and wound around the belt reels 110.

Figure 4:
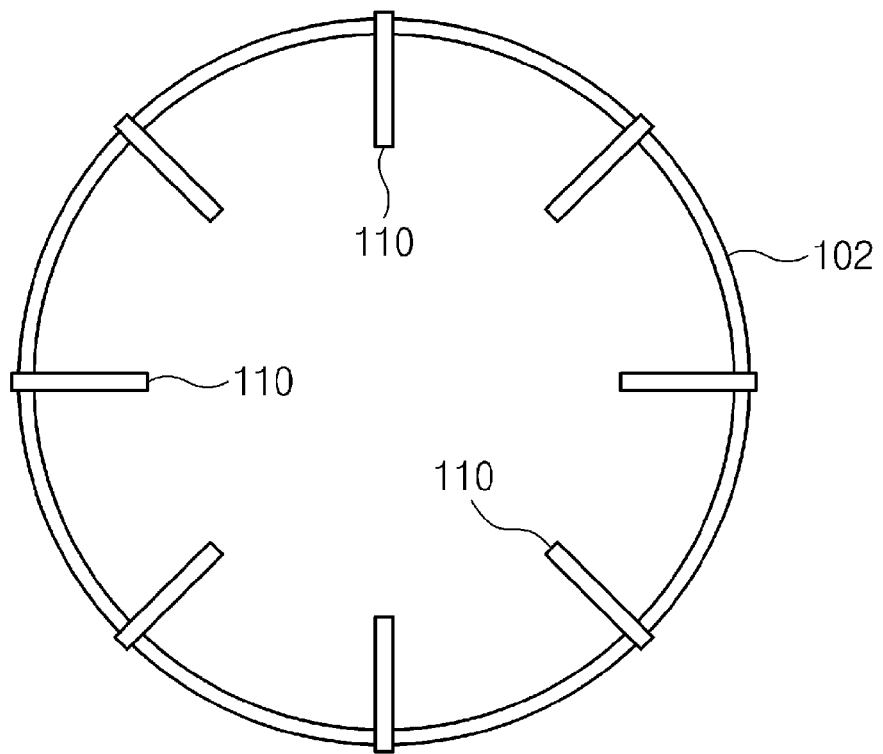
FIG. 4 is a side view illustrating the apparatus of FIG. 1 in the direction of arrow b, according to an embodiment of the present invention.

FIG. 4 is a side view illustrating the apparatus of FIG. 1 in the direction of arrow b of FIG. 1, according to an embodiment of the present invention. In FIG. 4, a superconducting tape is not shown for clarity. A plurality of transfer units are radially arranged about the centerline of a cylindrical drum 102 and are symmetric with respect to the centerline of the cylindrical drum 102. Referring to FIG. 4, a plurality of belt reels 110 are arranged at an angle of 45° to each other. If the superconducting tape (not shown in FIG. 4) is too tightly wound around belts (not shown) of the transfer units, portions of the superconducting tape that are not supported by the belts can be in contact with the cylindrical drum 102. In this case, a superconducting material can be non-uniformly deposited on the superconducting tape since the superconducting tape has contact portions and non-contact portions with the cylindrical drum 102. To prevent such non-uniform deposition of a superconducting material, the superconducting tape can be loosely wound around the belts of the transfer units.

Figure 5:
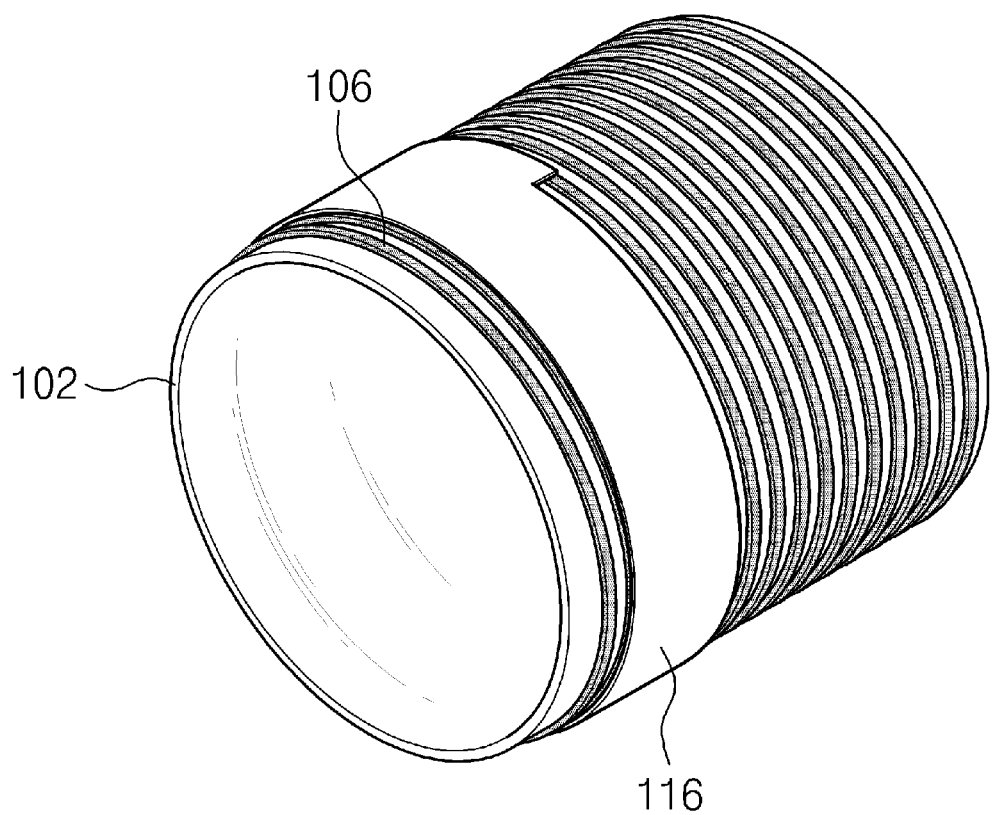
FIG. 5 is a perspective view illustrating a vapor block of the apparatus depicted in FIG. 1 according to an embodiment of the present invention.

Referring again to FIG. 1, in the apparatus of the present invention, the superconducting tape is fed into the deposition region (D) by the operation of the belt reels and the winding reel. Here, a portion of the superconducting tape placed in the deposition region (D) may be coated with a superconducting material by deposition, and the remaining portion of the superconducting tape may be not coated with the superconducting material. That is, the superconducting tape may not be simultaneously exposed to the superconducting material. In this case, it needs to minimize the boundary between the portion of the superconducting tape on which the superconducting material is deposited and the remaining portion of the superconducting tape on which the superconducting material is not deposited so as to improve characteristics of a superconductor layer to be formed on the superconducting tape. For this reason, the block 116 may be disposed in the vicinity of the release reel 104a. The block 116 may have a flat shape having a width corresponding to the drum. Alternatively, the block 116 may have a spiral edge corresponding to the superconducting tape wound around the drum as shown in FIG. 5. In this case, the spiral edge of the block 116 may have a discontinuous portion corresponding to the width of the superconducting tape. The discontinuous portion of the spiral edge of the block 116 may be disposed at a side opposite to the deposition region.

The block 116 operates as follows. The block 116 is reciprocated in a stepped manner. Here, one step corresponds to the width of the superconducting tape. Referring to FIG. 6, one turn 106a of the superconducting tape 106 covered with the block 116 is moved forward into the deposition region (D) together with the block 116. Referring to FIG. 7, only the block 116 is moved back by one step so as to simultaneously expose the one turn 106a of the superconducting tape 106 to the atmosphere of the deposition region (D).

An exemplary structure and operation of an apparatus for continuously fabricating superconducting tapes will now be described according to an embodiment of the present invention. In general, since a superconducting tape is formed of a hast alloy capable of maintaining its strength at a high-temperature, the superconducting tape can be stably held in grooves of belts. The belts are also formed of a hast alloy. The superconducting tape is inserted in the grooves of the belts at a somewhat low tension level by considering different temperature-dependent expansion rates of a cylindrical drum and the superconducting tape so as to prevent the superconducting tape from being in contact with the cylindrical drum. As explained above, portions of the superconducting tape inserted in the grooves of the belts do not make contact with bottom surfaces of the grooves, and the grooves of the belts are tapered upwardly to prevent the superconducting tape from being released from the grooves. The belts are continuously moved along the centerline of the cylindrical drum such that superconducting tape spirally wound around the drum can be moved from a release reel to a winding reel. For example, the superconducting tape, the release reel, the winding reel, the plurality of belts, and the cylindrical drum can be rotated once per second. The cylindrical drum, the superconducting tape wound around the cylindrical drum, the release reel feeding the superconducting tape, the winding reel collecting the superconducting tape, the belts (endless track belts), and belt reels rotating the endless belts are rapidly rotated in association with each other, and while these components are being rotated, a superconducting material is deposited on the superconducting tape. A method or mechanism for connecting such components can be easily determined based on structural parameters of the components such as lengths and diameters of the components. As the belts are moved, the superconducting tape spirally wound around the belts is moved along the centerline of the cylindrical drum, and the release and winding reels are rotated relative to the cylindrical drum for releasing or winding the superconducting tape. That is, when the superconducting tape is released from the release reel and is wound around the winding reel, a portion of the superconducting tape spirally wound around the cylindrical drum with a predetermined gap between the superconducting tape and the cylindrical drum is moved on the belts along the centerline of the cylindrical drum. In the apparatus of the present invention, belt portions and the other portions of the surface of the cylindrical drum need to be kept at the same temperature. For this, the other portions can have a double layer structure like the belt portions. For example, the other portions can be formed into a double layer structure by filling spaces located between the belts and separated from the belts with a material having thermal conductive characteristics similar to or equal to those of the belts.

Industrial Applicability

As described above, according to the apparatus of the present invention, a superconducting tape can be continuously fed and collected without affecting deposition of a superconductor layer on the superconducting tape. Therefore, the EDDC method can be used to fabricate a long superconducting tape.

The invention claimed is:

1. An apparatus for continuously fabricating superconducting tapes, comprising:
   a chamber configured to contain a first of the superconducting tapes as superconducting material is deposited on the first superconducting tape;
   a hollow cylindrical drum disposed in the chamber for winding the first superconducting tape around the cylindrical drum and heating the first superconducting tape;
   a release reel disposed at an end of the cylindrical drum for feeding the first superconducting tape;
   a winding reel disposed at another end of the cylindrical drum for collecting the first superconducting tape after the superconducting material is deposited on the first superconducting tape; and
   a transfer unit configured to transfer the first superconducting tape from the release reel to the winding reel, the transfer unit including
      an endless track belt disposed around a sidewall of the cylindrical drum in a loop shape parallel to a centerline of the cylindrical drum, the endless track belt comprising grooves arranged at predetermined intervals in a length direction of the endless track belt for receiving the superconducting tapes, the grooves being substantially perpendicular to the length direction of the endless belt, and
      belt reels configured to rotate the endless track belt so as to move a portion of the endless track belt along an outer surface of the cylindrical drum in a direction from the release reel to the winding reel.

2. The apparatus according to claim 1, wherein each of the grooves comprises:
   support jaw portions configured to support two sides of the first superconducting tape for preventing the first superconducting tape from making contact with a bottom surface of the groove; and
   a reversely inclined sidewall to make the groove tapered upwardly for keeping the first superconducting tape within the groove.

3. The apparatus of claim 2, wherein the support jaw portions are sloped toward sidewalls of the grooves such that the first superconducting tape makes line contact with the support jaw portions.

4. The apparatus of claim 1, wherein the transfer unit includes a plurality of transfer units including endless track belts and belt reels configured to rotate the endless track belts so as to move the endless track belts along the outer surface of the cylindrical drum in the direction from the release reel to the winding reel, wherein the transfer units are radially and symmetrically arranged about the centerline of the cylindrical drum.

5. The apparatus of claim 4, wherein the cylindrical drum, the first superconducting tape wound around the cylindrical drum, the release reel feeding the first superconducting tape, the winding reel collecting the first superconducting tape, the endless track belts, and the belt reels rotating the endless track belts are rapidly rotated in association with each other to release the first superconducting tape from the release reel and wind the first superconducting tape around the winding reel, such that a portion of the first superconducting tape, that is spirally wound around the cylindrical drum with a predetermined gap between the first superconducting tape and the cylindrical drum, is moved on the endless track belts along the centerline of the cylindrical drum from the release reel to the winding reel, and the superconducting material is deposited on the portion of the first superconducting tape.

6. The apparatus of claim 1, wherein the first superconducting tape is released from an inner region of the release reel and is wound around an inner region of the winding reel.

7. The apparatus of claim 1, further comprising a material on the outer surface on the cylindrical drum so that the cylindrical drum is kept at a same surface temperature level as that of the endless track belt.

8. The apparatus of claim 1, further comprising a spiral block disposed at a side of the release reel for leaving uncovered a portion of the first superconducting tape, on which the superconducting material is being deposited, while covering the remaining portion of the first superconducting tape, in a stepped manner.

9. The apparatus of claim 8, wherein when the first superconducting tape is exposed to a deposition vapor, the spiral block reciprocates in a stepped manner such that each turn of the first superconducting tape wound around the cylindrical drum is simultaneously exposed to the deposition vapor.

10. The apparatus of claim 1, wherein the belt reels are configured to rotate the endless track belt so that the direction from the release reel to the winding reel that the portion of the endless track belt moves in, is parallel to the centerline of the cylinder.

11. The apparatus of claim 1, wherein each groove supports the first superconducting tape therewithin so as to move the first superconducting tape via the endless track belt.

12. The apparatus of claim 11, wherein the first superconducting tape is separable from the endless track belt.

13. The apparatus of claim 1, wherein the belt reels are configured to rotate the endless track belt so that another portion of the endless track belt moves in another direction from the winding reel to the release reel.

14. The apparatus of claim 13, wherein the portion of the endless track belt moving in the direction from the release reel to the winding reel is disposed outside of the drum, and the another portion is disposed within the drum.

* * * * *